May 7, 1968 E. L. HUNTER 3,382,441

AUTOMATIC FREQUENCY CONTROL WITH TEMPERATURE COMPENSATED D-C COMPONENT

Filed March 22, 1965

INVENTOR

EDWARD L. HUNTER

BY,

*Wolf, Greenfield and Hieken*

ATTORNEYS 3,382,441
Patented May 7, 1968

3,382,441

AUTOMATIC FREQUENCY CONTROL WITH TEMPERATURE COMPENSATED D-C COMPONENT

Edward L. Hunter, Randolph, Mass., assignor to Automatic Radio Manufacturing Co., Inc., Melrose, Mass., a corporation of Massachusetts Filed Mar. 22, 1965, Ser. No. 441,824
3 Claims. (Cl. 325—422)

ABSTRACT OF THE DISCLOSURE

A receiver includes a mixer and a local oscillator whose frequency of oscillation is controlled by a capacitor and the capacity provided by a reverse-biased semiconductor rectifying junction. The local oscillator signal and input signal are mixed in the mixer to provide an intermediate frequency signal. A ratio detector provides a D-C control signal representative of the difference between the intermediate frequency and the normal intermediate frequency that is applied to the semiconductor diode to control the bias so that the capacity provided by the diode causes the local oscillator signal frequency to change and reduce the difference between the intermediate frequency and the normal intermediate frequency. The D-C control signal includes a D-C component provided by a temperature sensitive attenuator so as to maintain the intermediate frequency essentially at the normal value in the presence of wide temperature variations.

Figure 2:
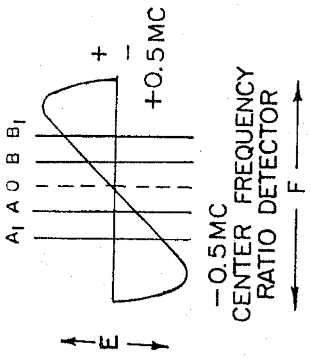

The present invention relates in general to automatic frequency control and more particularly concerns novel methods and means for effecting a high degree of frequency stability at very high frequencies in the presence of wide variations in temperature. A specific embodiment of the invention maintains exceptional frequency stability in a commercial fully transistorized frequency modulation tuner for vehicular use over an exceptionally wide range of temperatures.

Various techniques for automatic frequency control are well-known in the art. A typical system for use in an F-M receiver employs a variable reactance, such as a reverse-biased semiconductor diode, to control the local oscillator frequency in response to changes in the D-C level provided by a discriminator. The change in discriminator D-C level is representative of drift in center I-F frequency caused by the drift in local oscillator frequency. The change in variable reactance produced by this change in D-C level alters the local oscillator frequency so as to move the center intermediate frequency toward the discriminator center frequency.

While these ordinary techniques are adequate for many environments typically found in homes where wide temperature variations are less of a problem, the drift problem is more serious when the local oscillator is transistorized and a ratio detector provides the control signal. Standard techniques are inadequate to maintain the desired frequency control over the wide temperature ranges encountered in vehicles.

Accordingly, it is an important object of this invention to provide automatic frequency control efficiently operative over a wide range of temperatures.

It is another object of this invention to achieve the preceding object in a fully transistorized system.

It is still another object of this invention to achieve the preceding objects in a system where a ratio detector provides the signal for effecting automatic frequency control.

It is an object of the invention to achieve the preceding objects with relatively little additional apparatus, such additional apparatus comprising components relatively low in cost.

According to the invention, there is a source of local oscillator signal whose frequency of oscillation is controlled by means including a semiconductor rectifying junction. Means responsive to the local oscillator signal provide an intermediate frequency signal of center frequency that deviates from a normal center frequency by a frequency difference related to the frequency of the local oscillator signal. Means defining a ratio detector provide a D-C control signal representative of that frequency difference. Means couple the D-C control signal to the semiconductor rectifying junction to alter the local oscillator frequency so as to reduce the frequency difference. Means defining a temperature sensitive attenuator provide a D-C component of the D-C control signal related to the temperature of the environment of the automatic frequency control apparatus to maintain the frequency difference nearly zero in the presence of wide temperature variations.

Figure 1:
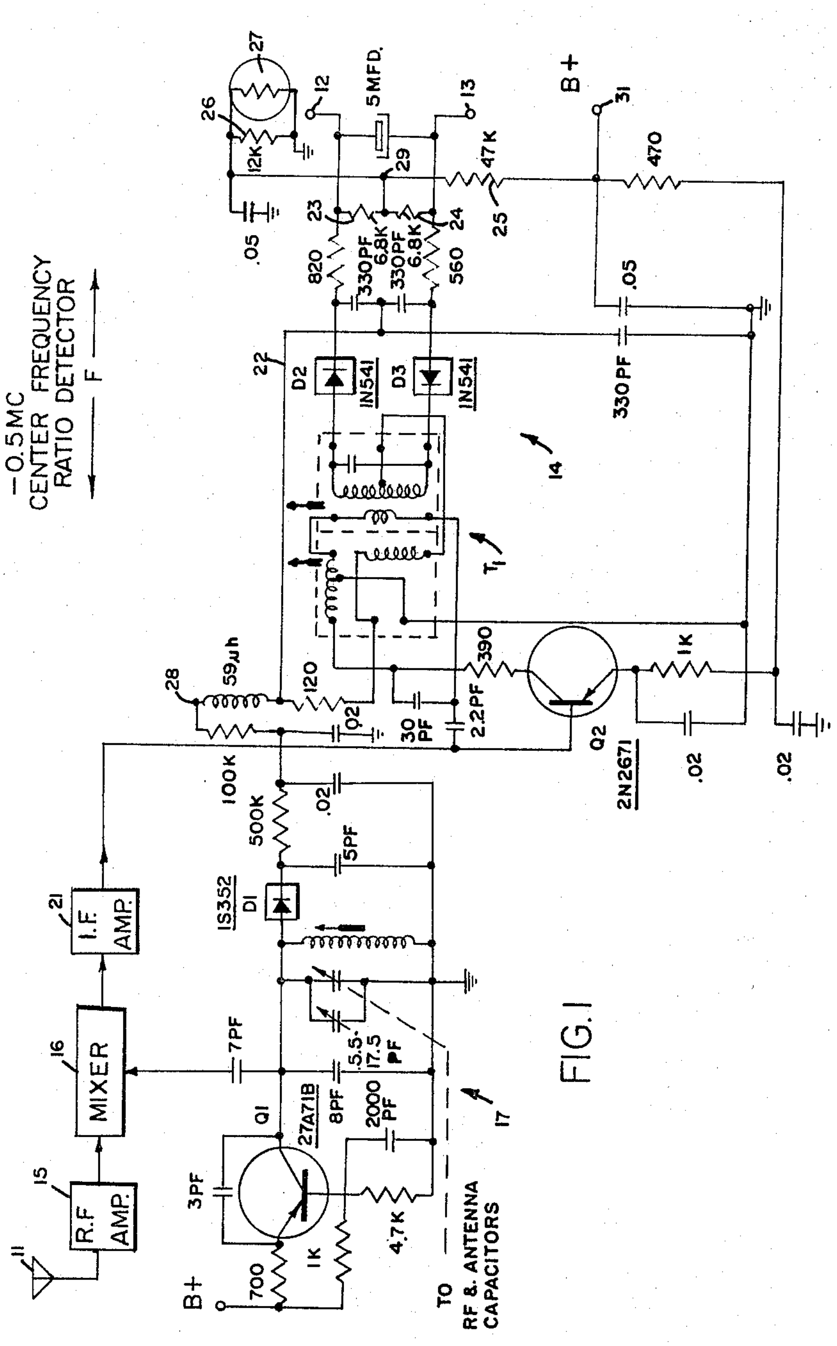

Numerous other features, objects and advantages of the invention will become apparent from the following specification when read in connection with the accompanying drawings in which:

FIG. 1 shows a combined block-schematic circuit diagram of a preferred embodiment of the invention in the form of an F-M tuner; and FIG. 2 shows a graphical representation of ratio detector D-C voltage as a function if I-F center frequency deviation from ratio detector center frequency.

Most of the conventional portions of the tuner are represented by appropriately labelled blocks to avoid obscuring the inventive concepts.

With reference now to the drawing, there is shown in FIG. 1 a combined block-schematic circuit diagram of a vehicular F-M tuner embodying the invention. A frequency modulated signal received by antenna 11 is converted to an audio signal appearing at junction 28 with respect to junction 29. This audio signal is coupled from junction 28 to the audio amplification and speaker system (not shown), which may be of any well known type.

R-F amplifier 15 amplifies the frequency modulated signal received by antenna 11 and applies the amplified signal to mixer 16. Local oscillator 17, comprising transistor Q1 and associated components, provides a local oscillator signal to mixer 16 which beats with the amplified frequency modulated signal to provide the frequency modulated signal centered about the intermediate frequency for amplification by I-F amplifier 21.

The amplified intermediate frequency signal from I-F amplifier 21 is applied to the base of the ratio detector driver transistor Q2 for application to the ratio detector transformer T1. The ratio detector 14 provides a signal between junctions 28 and 29 which is the composite of an audio frequency voltage derived from the frequency modulated carrier input and a D-C voltage which is proportional to the amount that the converted I-F signal frequency deviates from center frequency.

Referring to FIG. 2, there is shown a graphical representation of the ratio detector D-C voltage proportional to the amount that the converted I-F center frequency deviates from the ratio detector center frequency as a function of frequency.

The I-F signal amplified by I-F amplifier 21 is deviated above and below ratio detector center frequency by the frequency modulation on the incoming signal. If the signal deviates from A to B, the center of the resultant output is 0, the ratio detector center frequency, and the D-C potential between junctions 28 and 29 is zero. This zero potential indicates that the output intermediate frequency of the mixer 16 is centered in the I-F amplifier 21 pass band and that of the ratio detector.

If the I-F signal deviates in frequency from 0 to B1, the center frequency is B, and a positive D-C output voltage is derived at junction 28 relative to junction 29. This positive voltage indicates that the output intermediate frequency of the mixer 16 is not centered with respect to the pass band of the I-F amplifier 21 and the ratio detector center frequency.

Conversely, if the signal deviates from 0 to A1, the center of that deviation range is A, resulting in a negative potential at junction 28 with respect to junction 29. This negative potential indicates that the output of mixer 16 is not centered and is on the other side of center than is the case when the D-C potential at junction 28 with respect to junction 29 is positive.

The amplified intermediate frequency signal from I-F amplifier 21 is applied to the base of ratio detector driver transistor Q2 for application to the ratio detector transformer T1. The ratio detector 14 provides the audio modulation component and a D-C control signal on line 22 representative of the deviation of the I-F signal center frequency from the ratio detector center frequency. The D-C control signal on line 22 is coupled through low pass filtering circuitry to provide a potential applied to the cathode of diode D1 reverse biasing that diode so as to establish its effective capacity at a value that controls the frequency of local oscillator 17 so as to minimize the frequency difference between the center frequency provided by I-F amplifier 21 and the center frequency of ratio detector 14.

Since the local oscillator and ratio detector circuitry shown operates in a known manner, a detailed discussion of the oscillation and ratio detection functions is not included so as not to detract from the exposure of the principles of the invention.

The D-C control signal provided on line 22 includes a temperature sensitive D-C component dependent upon the D-C potential between resistors 23 and 24. The potential on the junction of these two resistors in turn depends upon the potential established by the voltage divider comprising resistor 25 in series with the parallel combination of resistor 26 and thermistor 27, this attenuator being connected between the B+ terminal 31 and ground.

Since the resistance of thermistor 27 is inversely proportional to temperature, the degree of attenuation imparted by the attenuating means increases with increasing temperature so that the D-C potential on the junction between resistors 23 and 24 (and consequently the temperature sensitive D-C component of potential on line 22) decreases with increasing temperature. This decrease in potential in response to an increase in temperature reduces the reverse bias on diode D1 to increase its effective capacity and lower the local oscillator frequency. Note that the effect of this temperature sensitive capacity variation is to provide a frequency controlling capacitor with effective positive temperature coefficiency. This is an important result because temperature compensating capacitors with positive temperature coefficients are not readily available to provide practical temperature compensation. The compensation thus produced tends to compensate for the normal tendency of the local oscillator to increase its frequency with a rise in temperature and allow the ratio detector control to effect fine frequency control so that exceptional frequency stability is obtained over a wide range of temperatures.

In the conventional ratio detector, junction 29 is grounded, and the D-C potential on junction 28 is with respect to ground. In this temperature stable system according to the invention, the potential on junction 29 varies with temperature. This variation in no way interferes with the audio or D-C signal developed between junctions 28 and 29, but it does affect the potential reverse biasing diode D1. The bias on diode D1 is proportional to the sum of the D-C potential between junctions 28 and 29 and that developed between junction 29 and ground.

This invention is actually embodied in the commercially available F-M tuner converter type FM-5099 manufactured by Automatic Radio Mfg. Co., Inc. Measurements on an unstabilized tuner showed frequency shifts of 3.8 mc. with 20 microvolts input over the temperature range from −30° F. to +180° F., or approximately 17 kc. per degree F. Over the same temperature range a tuner temperature compensated according to the invention showed (at the same tuning frequency of 107 mc.) a change of 340 kc. or approximately 1.6 kc. per degree F. At this frequency there was overcompensation while at the low end of the band there is under compensation, there being a frequency near the middle of the band where compensation is perfect. By choosing production component values for perfect compensation at midband with overcompensation at the high end and undercompensation at the low end, temperature sensitive drift over the entire band is minimized.

The invention is especially useful when used in a push button tuner because the push buttons are normally set either in summer or winter and expected to require no resetting in the other season. This invention is also used in 1965 model AM-FM radios manufactured by Automatic Radio Mfg. Co., Inc. Tests on these radios have shown absolute push button repeatability from −40° F. to +195° F. with input signal strength of 20 microvolts.

It is apparent that those skilled in the art may now make numerous modifications of and departures from the specific embodiment described herein without departing from the inventive concepts. Consequently, the invention is to be construed as limited solely by the spirit and scope of the appended claims.

What is claimed is:

1. Automatic frequency control apparatus comprising,
a source of a local oscillator signal,
means responsive to said local oscillator signal for providing an intermediate frequency signal having a center value which deviates from a standard center frequency by a frequency difference related to the frequency of said local oscillator signal,
a source of a direct potential connected between a high terminal and a common terminal,
means including a semiconductor rectifying junction having first and second electrodes for controlling the frequency of said local oscillator signal,
means for direct coupling said first electrode to said common terminal,
means defining a ratio detector responsive to said intermediate frequency signal for providing a first component of a D-C control signal related to the sense and magnitude of said frequency difference,
means defining a temperature sensitive attenuator connected between said high terminal and said common terminal for providing a second component of said D-C control signal related to the ambient temperature of the environment surrounding said apparatus,
said ratio detector having a bridge circuit including a pair of serially connected capacitors in parallel with a pair of serially connected resistances with the junction of said serially connected resistances direct coupled to said temperature sensitive attenuator,
and means for direct coupling the junction of said serially connected capacitors to said second electrode to reverse bias said semiconductor rectifying junction with said D-C control signal and alter said local oscillator frequency so as to reduce said frequency difference.

2. Automatic frequency control apparatus in accordance with claim 1 wherein said means defining a temperature sensitive attenuator comprises a first resistance connected to said high terminal in series with the parallel combination of a second resistance and a thermistor connected to said common terminal, the junction of said first and second resistances being directly coupled to the junction of said pair of resistances.

3. Automatic frequency control apparatus comprising, a source of a local oscillator signal, means responsive to said local oscillator signal for providing an intermediate frequency signal having a center value which deviates from a standard center frequency by a frequency difference related to the frequency of said local oscillator signal, means including a semiconductor rectifying junction for controlling the frequency of said local oscillator signal, means defining a ratio detector for providing a first component of a D-C control signal related to the sense and magnitude of said frequency difference, means defining a temperature sensitive attenuator for providing a second component of said D-C control signal related to the ambient temperature of the environment surrounding said apparatus, means for applying said D-C control signal to said semiconductor rectifying junction to reverse bias said junction and alter said local oscillator frequency so as to reduce said frequency difference and maintain said frequency difference nearly zero in the presence of wide variations in said ambient temperature, said temperature sensitive attenuator comprising a source of a fixed potential and a first resistance connected in series with the parallel combination of a second resistance and a temperature sensitive resistance across said source of fixed potential, said ratio detector including a bridge circuit having a pair of serially connected capacitors in parallel with a pair of serially connected resistances, the junction of said first resistance and the parallel combination of said second resistance and said temperature sensitive resistance being connected to the junction of said pair of resistances, the junction of said pair of capacitors providing said D-C control signal, and means for direct coupling the junction of said pair of capacitors to said semiconductor rectifying junction.

References Cited

UNITED STATES PATENTS

| | | | |
|---|---|---|---|
| 2,496,063 | 1/1950 | Mural | 325—423 XR |
| 2,811,647 | 10/1957 | Nilssen | 331—36 XR |
| 3,251,008 | 5/1966 | Schweitzer | 331—36 XR |

KATHLEEN H. CLAFFY, *Primary Examiner.*

R. LINN, *Assistant Examiner.*